United States Patent [19]

Epstein

[11] 3,740,681

[45] June 19, 1973

[54] VOLTAGE CONTROLLED CRYSTAL OSCILLATOR

[75] Inventor: Philip L. Epstein, Elizabeth, N.J.

[73] Assignee: Quindar Electrics, Inc., Springfield, N.J.

[22] Filed: June 16, 1972

[21] Appl. No.: 263,478

[52] U.S. Cl. ............ 331/177 R, 331/116 R, 332/26

[51] Int. Cl. ............................................. H03b 3/04

[58] Field of Search ........... 331/116 R, 158, 177 R, 331/1 A; 332/26

[56] References Cited

UNITED STATES PATENTS 3,378,786 4/1968 Andrea .......................... 331/177 R

*Primary Examiner*—John Kominski

*Attorney*—Gerald Altman, Richard J. Oates and Herbert L. Bello

[57] ABSTRACT

A crystal oscillator frequency signal and a shift frequency signal are selectively combined in a PUT and TAKE circuit comprising digital dividers and logic gating. An output signal from a ramp generator which is derived from the crystal oscillator frequency signal is compared in a comparator with an input D.C. voltage. PUT and TAKE signals generated by the comparator are applied to the PUT and TAKE circuit for selective control thereof. The PUT and TAKE circuit generates a signal having a frequency which is determined by the magnitude of the input D.C. voltage and varies linearly with changes in the input D.C. voltage.

9 Claims, 2 Drawing Figures

VOLTAGE CONTROLLED CRYSTAL OSCILLATOR

BACKGROUND OF THE INVENTION

1. Field of Invention

The present invention relates to frequency generating devices and, more particularly, is directed towards a voltage controlled crystal oscillator.

2. Description of the Prior Art

Voltage controlled oscillators are employed in analog telemetry systems for transmission of a measured quantity from one location to another. Generally, such systems employ voltage controlled oscillators which generate a signal having a frequency proportional to a D.C. signal applied at an input terminal thereof. The frequency signal is transmitted over a communications facility and is demodulated at a receiver to recover the D.C. quantity. Due to the lack of frequency stability of the voltage controlled oscillators in the transmitters and receivers, such systems have suffered from the disadvantage of widely separated channel spacings and limited accuracy in the recovered signals.

SUMMARY OF THE INVENTION

It is an object of the present invention to provide a voltage controlled crystal oscillator which does not suffer from the heretofore mentioned disadvantages. The voltage controlled crystal oscillator provided by the present invention is characterized by a PUT and TAKE circuit comprising digital dividers and logic gating for generating a signal having a frequency which varies linearly with changes in an input D.C. voltage. Center and shift frequency signals derived from a crystal oscillator, are selectively combined in the PUT and TAKE circuit. A signal having a ramp waveform is generated by a ramp generator and is fed to one input terminal of a comparator. The D.C. input voltage is applied to another input terminal of the comparator which compares the instantaneous amplitude of the ramp waveform to the input D.C. voltage. PUT and TAKE pulse signals generated by the comparator are applied to the PUT and TAKE circuit. The center and shift frequency signals are selectively combined in the PUT and TAKE circuit as a function of the PUT and TAKE signals applied thereto. The frequency of the signal generated by the PUT and TAKE circuit is governed by the relative duration of the PUT and TAKE pulse signals and varies linearly with changes in the input D.C. voltage.

The invention accordingly comprises the system possessing the construction, combination of elements, and arrangement of parts that are exemplified in the following detailed disclosure, the scope of which will be indicated in the appended claims.

BRIEF DESCRIPTION OF THE DRAWINGS

For a fuller understanding of the nature and objects of the present invention, reference should be had to the following detailed description taken in connection with the accompanying drawings wherein.

DETAILED DESCRIPTION OF THE INVENTION

Figure 1:
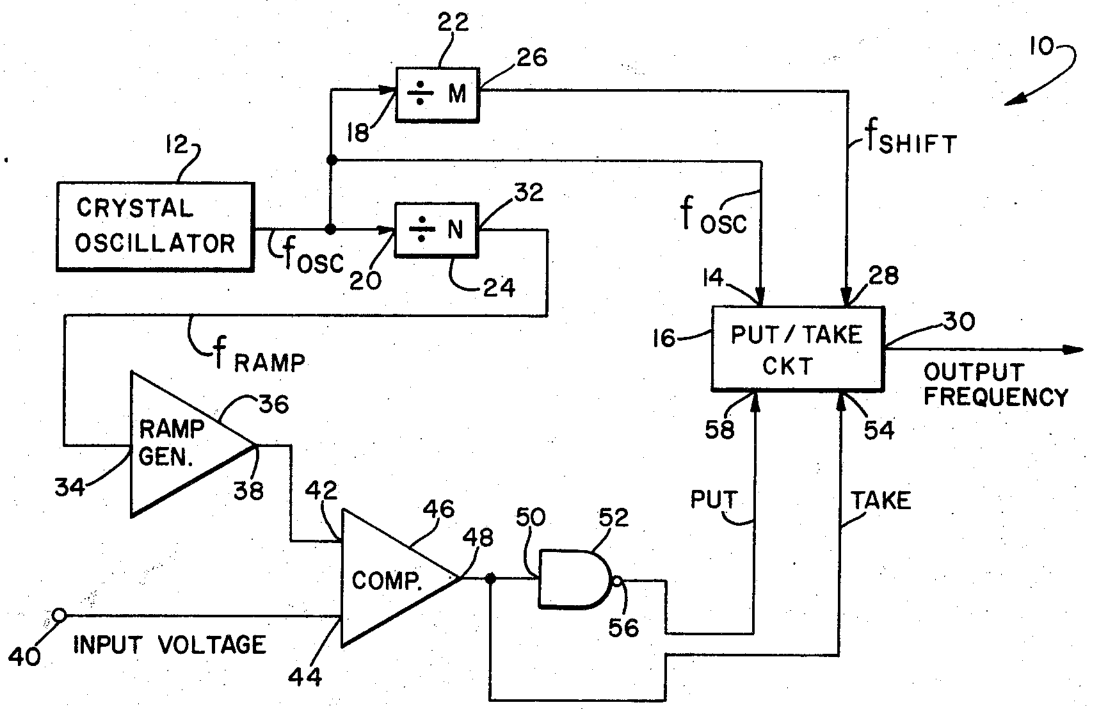
FIG. 1 is a block and schematic diagram of a voltage controlled crystal oscillator embodying the present invention.

Referring now to the drawings, particularly to FIG. 1, there is shown a voltage controlled crystal oscillator 10 for generating a signal having a frequency which varies linearly with changes in an input D.C. voltage. Voltage controlled crystal oscillator 10 comprises a crystal oscillator 12, a PUT and TAKE circuit 16, a ramp generator 36 and a comparator 46.

Crystal oscillator 12 generates a signal ($f_{osc}$) which is fed to an input terminal 14 of PUT and TAKE circuit 16 and to input terminals 18,20 of dividers 22, 24, respectively. A shift frequency signal ($f_{shift}$) at an output terminal 26 of divider 22, for example a divide by M circuit, is applied to an input terminal 28 of PUT and TAKE circuit 16. It is to be understood that, in alternative embodiments, ($f_{shift}$) is generated by means other than by dividing ($f_{osc}$), for example, an oscillator such as a unijunction transistor oscillator. As hereinafter described, the signals ($f_{osc}$) and ($f_{shift}$) are selectively combined in PUT and TAKE circuit 16 for presenting, at an output terminal 30, a signal characterized by high frequency stability.

A signal ($f_{ramp}$) as at an output terminal 32 of divider 24, for example a divide by N circuit, is fed to an input terminal 34 of ramp generator 36. A signal having a ramp waveform at an output terminal 38 of ramp generator 36 and an input D.C. voltage as at a terminal 40 are applied to a pair of input terminals 42, 44, respectively, of comparator 46. Pulse signals at an output terminal 48 of comparator 46 represents a comparison of the instantaneous amplitude of the ramp waveform to the input D.C. voltage. Output terminal 48 of comparator 46 is connected to an input terminal 50 of a gate 52, for example a NAND gate, and a control terminal 54 of PUT and TAKE circuit 16. An output terminal 56 of NAND gate 52 is connected to a control terminal 58 of PUT and TAKE circuit 16. For convenience, the pulsed signals applied to control terminals 54 and 56 are denoted as PUT and TAKE signals, respectively.

By way of example, the operation of voltage controlled crystal oscillator 10 will be described for input D.C. voltages at return, positive and negative potentials. As hereinbefore indicated, comparator 46 compares the instantaneous amplitude of the ramp waveform to the input D.C. voltage. When the input D.C. voltage is at a return potential, for example ground potential, the output signal of comparator 46 is low during one half the ramp period and high during the other half of the ramp period. Therefore, the PUT signal is presented at terminal 58 for one half the ramp period and the TAKE signal is presented at terminal 54 for one half the ramp period. That is, the number of PUT signal pulses and the number TAKE signal pulses applied to PUT and TAKE circuit 16 are equal. In consequence, ($f_{osc}$) and ($f_{shift}$) are combined in PUT and TAKE circuit 16 in such a manner that the signal at output terminal 30 is at center frequency.

When the input D.C. voltage is at a positive potential with respect to ground, the output signal of comparator 46 is low for more than one half of the ramp period and high for less than one half the ramp period. Therefore, the PUT signal is presented at terminal 58 for a greater period of time than the TAKE signal is presented at terminal 54. That is, the number of PUT pulses applied to PUT and TAKE circuit 16 is greater than the number of TAKE pulses applied thereto. In consequence, ($f_{osc}$) and ($f_{shift}$) are combined in PUT and TAKE circuit 16 in such a manner that the signal at output terminal 30 is at a high frequency ($f_c + f_1$). It is to be understood that $f_1$ varies linearly with the input D.C. voltage.

Figure 2:
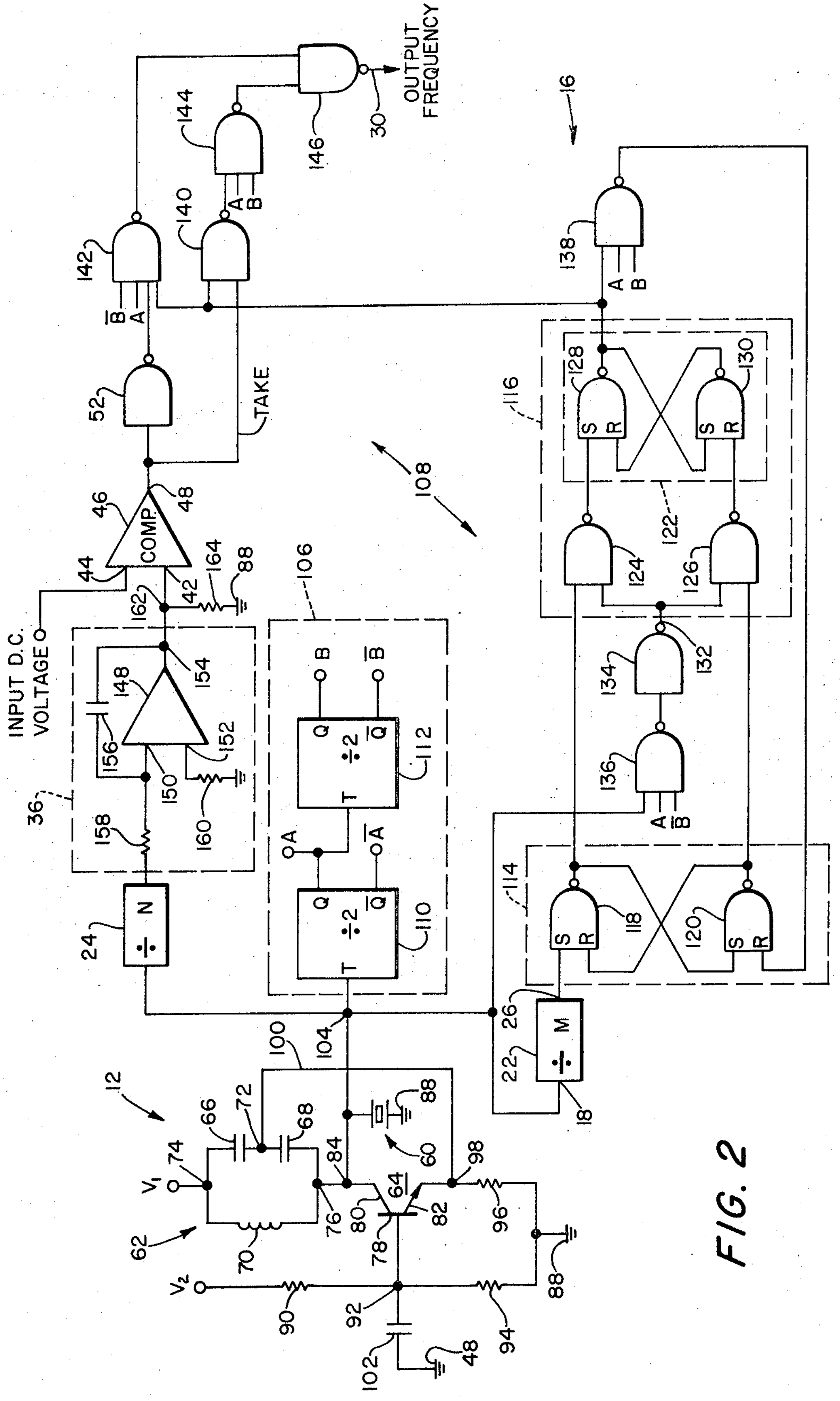
FIG. 2 is a detailed schematic diagram of FIG. 1.

When the input D.C. voltage is at a negative potential with respect to ground, the output signal of comparator 46 is high for more than one half of the ramp period and low for less than one half of the ramp period. Therefore, the TAKE signal is presented for a greater period of time at terminal 54 than the PUT signal is presented at terminal 58. That is, the number of TAKE pulses applied to PUT and TAKE circuit 16 is greater than the number of PUT pulses applied thereto. In consequence, ($f_{osc}$) and ($f_{shift}$) are combined in PUT and TAKE circuit 16 in such a manner that the signal at output terminal 30 is at a low frequency ($f_c - f_1$). For a fuller understanding of the invention, reference is made to the detailed schematic of FIG. 2.

Crystal oscillator 12 comprises a crystal 60, a tuned circuit 62 and a semiconductor 64. Tuned circuit 62 includes series capacitors 66, 68 which are connected in parallel with an inductor 70, one side of capacitors 66 and 68 being joined at a junction 72. The other side of capacitor 66 is connected to one side of inductor 70 at a junction which is adapted to receive a voltage $V_1$. The other side of capacitor 68 and the other side of inductor 70 are joined at a junction 76. Semiconductor 64, for example an NPN transistor, includes a base contact 78, a collector contact 80 and an emitter contact 82. JUnction 76 and collector 80 are joined at a junction 84. Crystal 60 is connected between junctions 84 and a return 88, for example a ground. A voltage $V_2$ is applied to base 78 through a resistor 90, base 78 and resistor 50 being joined at a junction 92 which is further connected to ground 88 through a resistor 94. Emitter 82 is connected to ground 88 via a resistor 96, the junction of emitter 82 and resistor 96 denoted by reference character 98. Junction 72 is tied to junction 98 by means of a line 100. A by-pass capacitor 102 is serially connected between junction 92 and ground 88. The signal ($f_{osc}$) is presented at a junction 104 which is common to junction 84. Junction 104 is further connected to PUT and TAKE circuit 16.

PUT and TAKE circuit 16 comprises a divider 106 and associated gating circuitry 108. In the illustrated embodiment, by way of example, divider 106 is a counter and includes flip-flops 110, 112, each flip-flop having a trigger input terminal T and output terminals Q and $\overline{Q}$. For convenience, the signals presented at the Q and $\overline{Q}$ terminals of flip-flop 110 are denoted by the characters A and $\overline{A}$, respectively, and the signals presented at the Q and $\overline{Q}$ terminals of flip-flops 112 are denoted by the characters B and $\overline{B}$. It is to be understood that $\overline{A}$ and $\overline{B}$ represent high logic levels, for example digital ones; and A and B represent low logical signals, for example digital zeros. The signal ($f_{osc}$) at junction 104 is applied to trigger input terminal T of flip-flop 110. The Q output terminal of flip-flop 110 is connected to the trigger input terminal T of flip-flop 112. In the preferred embodiment, by way of example, counter 106 is a divide by four counter, each flip-flop 110, 112 operating as a divide by two counter. It is to be understood that, in alternative embodiments, divider 106 is other than a counter, for example a shift register. The A, $\overline{A}$, B and $\overline{B}$ signals are processed in gating circuits 108 is the manner hereinafter described.

Gating circuitry 108 comprises a latch 114 and a clocked NAND gate flip-flop 116. Latch 114 includes NAND gates 118 and 120; each NAND gate 118, 120 having a set terminal, a reset terminal and an output terminal. The set and reset terminals of NAND gates 118,120 are denoted by the characters S and R, respectively. The set terminal of NAND gate 118 is connected to junction 104 via divider 22 and the set terminal of NAND gate 120 is connected to the output terminal of NAND gate 118. The output terminals of NAND gates 118 and 120 are further connected to clocked NAND gate flip-flop 116.

Clocked NAND gate flip-flop 116 includes a latch 122 and NAND gates 124, 126. Latch 122 includes NAND gates 128,130; each NAND gate 128,130 having a set terminal, a reset terminal and an output terminal. The set and reset terminals of NAND gates 128,130 are denoted by the characters S and R, respectively. The reset terminal of NAND gate 128 is connected to the output terminal of NAND gate 130 and the set terminal of NAND gate 130 is connected to the output terminal of NAND gate 128. The output terminals of NAND gates 124 and 126 are connected respectively to the set terminal of NAND gate 128 and the reset terminal of NAND gate 130. One of the input terminals of each NAND gate 124 and 126 is tied to a common trigger line 132. The other input terminal of NAND gates 124 and 126 is connected to the output terminal of NAND gates 118 and 120, respectively. Common trigger line 132 is connected to an output terminal of a NAND gate 134. An input terminal of NAND gate 134 is connected to an output terminal of a three input terminal NAND gate 136. The $\overline{A}$, $\overline{B}$ and ($f_{osc}$) signals are applied to the three input terminals of NAND gate 136, one signal being applied to one input terminal thereof. The output terminal of NAND gate 128 is connected to one input of NAND gates 138, 140 and 142.

NAND gate 138, for example a three input terminal NAND, receives the A and B signals at its other two input terminals. The output terminal of NAND gate 138 is connected to the reset terminal of NAND gate 120. NAND gate 140, for example a two input terminal NAND gate, receives on its second input terminal the TAKE signal generated by comparator 46. An output terminal of NAND gate 140 is connected to one input terminal of a three input terminal NAND gate 144, the A and B signals being applied to the other two input terminals thereof. The output terminal of NAND gate 144 is tied to one input terminal of a two input terminal NAND gate 146. The other input terminal of NAND gate 146 is connected to the output terminal of NAND gate 142, for example a four input terminal NAND gate. The PUT signal generated by NAND gate 52 and the A and B signals are applied to the three free input terminals of NAND gate 142. The A and B signals generated by divider 106 are applied to two of the free input terminals of NAND gate 142 and the PUT signal is applied to the remaining free input terminal of NAND gate 142. The PUT and TAKE signals applied to NAND gates 142 and 140, respectively are derived from comparator 46 which receives the input D.C. voltage and the ramp waveform from ramp generator 36.

In the illustrated embodiment, ramp generator 36 is in the form of an integrator 148 comprising an operation amplifier having differential input terminals 150,152 and an output terminal 154. A capacitor 156 is connected between output terminal 154 and input terminal 150. Divider 24 is connected to input terminal 150 through a resistor 158. Input terminal 152 is connected to ground 88 through a resistor 160. Output terminal 154 is connected to input terminal 42 of comparator 46 at a junction 162 which is further connected to ground 88 through a resistor 164.

As previously indicated, the ($f_{osc}$) and ($f_{shift}$) signals are combined selectively in PUT and TAKE circuit 16 for generating a signal having a frequency which varies linearly with changes in the input D.C. voltage. The ($f_{shift}$) signal at terminal 26 of divider 22 operates to set latch 114. The signals at the output of latch 114 are gated with the $\overline{A}$ and $\overline{B}$ signals generated by divider 106 and the ($f_{osc}$) signal generated by crystal oscillator 12 via NAND gates 136, 134, 124 and 126 in order to set latch 122. The signal at the output of latch 122 is gated with the A and B signals in NAND gate 138 to reset latch 114. The signal at the output of latch 122 is gated also with the TAKE signal in NAND gate 140 and with the A, $\overline{B}$ and PUT signals in NAND gate 142.

As noted in connection with the examples of system operation hereinbefore described, when the input D.C. voltage is at ground potential, the signal at the output of comparator 46 is low during one half the ramp period and high during the other half of the ramp period. The number of PUT signal pulses applied to NAND gate 142 is equivalent to the number of TAKE signal pulses applied to NAND gate 140. The PUT signal pulses are gated with the TAKE signal pulses via NAND gate 144 in NAND gate 146 to generate an output signal at center frequency.

When the input D.C. voltage is at a positive potential with respect to ground, the output signal of comparator 46 is low during a greater portion of the ramp period and high during a lesser portion of the ramp period. The number of PUT signal pulses applied to NAND gate 142 is greater than the number of TAKE signal pulses applied to NAND gate 140. The increased PUT signal pulses, via NAND gates 142 and 146, operate to increase the frequency of the output signal. That is, NAND gate 146 produces an output signal for every fourth pulse of the ($f_{osc}$) signal plus the pulses of the ($f_{shift}$) signal.

When the input D.C. voltage is at a negative potential with respect to ground, the output signal of comparator 46 is high during a greater portion of the ramp period and low during a lesser portion of the ramp period. The number of TAKE pulses applied to NAND gate 140 is greater than the number of PUT signal pulses applied to NAND gate 142. The increased TAKE pulses via NAND gate 140 operates to inhibit the output signal of NAND gate 144 and the next A and B transition of counter 106. That is, NAND gate 146 produces an output signal for every fourth pulse of the ($f_{osc}$) signal minus the pulses of the ($f_{shift}$) signal.

Since certain changes may be made in the foregoing disclosure without departing from the scope of the inventionherein involved, it is intended that all matter contained in the above description and depicted in the accompanying drawings be construed in an illustrative and not in a limiting sense.

What is claimed is:

1. A voltage controlled crystal oscillator comprising:

a. crystal oscillator means for generating a first signal of precise frequency;

b. first means for generating a shift frequency signal, said shift frequency signal related to said first signal;

c. second means for generating a second signal having a given waveform, said second signal derived from said first signal;

d. terminal means adapted for reception of an input D.C. voltage;

e. third means operatively connected to said second means and terminal means for comparing said second signal and said input D.C. voltage and for generating third signals related to said comparison; and f. PUT and TAKE means operatively connected to said crystal oscillator means, said first means and said third means for selectively combining said first and shift frequency signals as a function of said third signals and for generating an output signal having a frequency related to said input D.C. voltage.

2. The voltage controlled crystal oscillator as claimed in claim 1 wherein said PUT and TAKE means includes counter means and logic means, said counter means operatively connected between said crystal oscillator means and said logic means, said counter means operating to generate high and low logic level signals for selectively gating said logic means.

3. The voltage controlled crystal oscillator as claimed in claim 1 wherein said second means is a ramp generator and said given waveform is a ramp.

4. The voltage controlled crystal oscillator as claimed in claim 1 wherein said first means is a divider operatively connected between said crystal oscillator means and said PUT and TAKE means, said shift frequency signal derived from said first signal.

5. A voltage controlled crystal oscillator comprising:

a. crystal oscillator means for generating a first signal of precise frequency;

b. first means for generating a shift frequency signal;

second means operatively connected to said crystal oscillator means for generating a second signal having a given waveform, said second signal derived from said first signal;

d. terminal means adapted for reception of an input D.C. voltage;

e. third means operatively connected to said second means and terminal means for comparing said second signal and said input D.C. voltage and for generating third and fourth signals related to said comparison;

f. counter means operatively connected to said crystal oscillator means for generating fifth, sixth, seventh and eighth signals, said fifth and seventh signals being logical ones and said sixth and eighth signals being logical zeros, said seventh and eighth signals derived from said fifth signal; and g. gating means operatively connected to said crystal oscillator means, said first means, said third means, and said counter means for selectively combining said first and shift frequency signals as a function of said third, fourth, fifth, sixth, seventh and eighth signals and for generating an output signal having a frequency related to said input D.C. voltage.

6. The voltage controlled crystal oscillator as claimed in claim 5 wherein said counter means includes:

a. first divider means having at least one input terminal and first and second output terminals, said first divider means input terminal operatively connected to said crystal oscillator means, said fifth signal presented said first divider means first output terminal and said sixth signal presented said first divider means second output terminal; and b. second divider means having at least one input terminal and first and second output terminals, said first divider means first output terminal operatively connected to said second divider means input terminal, said seventh signal presented at said second divider means first output terminal and said eighth signal presented at said second divider means second output terminal.

7. The crystal controlled variable frequency oscillator as claimed in claim 5 wherein said gating means includes:

a. first latch means having input and output means, said first latch means input means operatively connected to said first means, a ninth signal presented at said first latch means output means;

b. second latch means having input and output means, said second latch means input means operatively connected to said first latch means output means, a tenth signal presented at said second latch means output means;

c. said third signal being a PUT signal;

d. said fourth signal being a TAKE signal;

e. first NAND gate means having input and output means, said first NAND gate input means receiving said fifth, eighth, tenth and PUT signals;

f. second NAND gate means having input and output means, said second NAND gate input means receiving said tenth and TAKE signals;

g. third NAND gate means having input and output means, said third NAND gate input means gated by a signal at said second NAND gate output means and by said fifth and seventh signals;

h. fourth NAND gate means having input and output means, said fourth NAND gate input means operatively connected to and gated by said first and third NAND gate output means;

i. fifth NAND gate means having input and output means, said fifth NAND gate input means gated by said first, sixth, and eighth signals;

j. sixth NAND gate means having input and output means, said sixth NAND gate input means operatively connected to said fifth NAND gate output means said sixth NAND gate means output means operatively connected to said second latch means input means; and k. seventh NAND gate means having input and output means, said seventh NAND gate gated by said fifth, seventh and tenth signals, said seventh NAND gate output means operatively connected to said first latch means input means.

8. A voltage controlled crystal oscillator comprising:

a. crystal oscillator means for generating a first signal of precise frequency;

b. first means operatively connected to said crystal oscillator means for generating a shift frequency signal, said shift frequency signal related to said first signal;

c. ramp generator means operatively connected to said crystal oscillator means for generating a second signal having a ramp waveform, said second signal derived from said first signal;

d. terminal means adapted for reception of an input D.C. voltage;

e. comparator means operatively connected to said ramp generator means and terminal means for comparing said second signal and said input D.C. voltage and for generating TAKE signals related to said comparison;

f. second means operatively connected to said comparator means for converting said TAKE signals to PUT signals; and g. PUT and TAKE means operatively connected to said crystal oscillator means, said first means and said comparator means for selectively combining said first and shift frequency signals as a function of the relative duration of said PUT and TAKE signals and for generating an output signal having a frequency related to said input D.C. voltage.

9. The voltage controlled crystal oscillator as claimed in claim 8 wherein said PUT and TAKE means includes counter means and logic means, said counter means operatively connected between said crystal oscillator means and said logic means, said counter means operating to generate high and low logic level signals for selectively gating said logic means.

* * * * *